United States Patent [19]
Kodani et al.

[11] Patent Number: 6,166,402
[45] Date of Patent: Dec. 26, 2000

[54] PRESSURE-CONTACT TYPE SEMICONDUCTOR ELEMENT AND POWER CONVERTER THEREOF

[75] Inventors: Kazuya Kodani; Toshiaki Matsumoto; Masayuki Tobita, all of Tokyo, Japan

[73] Assignee: Kabushiki Kaisha Toshiba, Kawasaki, Japan

[21] Appl. No.: 09/335,702

[22] Filed: Jun. 18, 1999

[30] Foreign Application Priority Data

Jun. 18, 1998 [JP] Japan .................................. 10-171645

[51] Int. Cl.$^7$ ........................... H01L 29/74; H01L 31/111
[52] U.S. Cl. ........................ 257/182; 257/153; 257/138; 257/181; 257/151; 257/150; 257/688
[58] Field of Search ................................. 257/108, 150, 257/151, 181, 138, 147, 153, 182, 726, 727, 785, 688

[56] References Cited

U.S. PATENT DOCUMENTS

| 5,043,795 | 8/1991 | Takahashi et al. . |
| 5,519,253 | 5/1996 | Lake et al. . |
| 5,652,467 | 7/1997 | Onise et al. . |
| 5,739,556 | 4/1998 | Bolgaini . |
| 5,777,351 | 7/1998 | Taguchi et al. . |
| 6,072,200 | 6/2000 | Gruning et al. . |

FOREIGN PATENT DOCUMENTS 10-2568551  1/1998  Japan .

*Primary Examiner*—Sheila V. Clark
*Attorney, Agent, or Firm*—Foley & Lardner

[57] ABSTRACT

A double circular gate conductor 9 comprises a first circular gate conductor 7 connected to a gate electrode 2a, a second circular gate conductor 8, and a connecting conductor which connects the first circular gate conductor 7 and the second circular gate conductor 8, and is configured so as to equalize the voltage drop due to self-inductance or mutual inductance between the first circular gate conductor 7, second circular gate conductor 8 and cathode post electrode 4. In this manner it is possible to guarantee more or less uniform parallel inductance over the surface of the element.

14 Claims, 8 Drawing Sheets

PRESSURE-CONTACT TYPE SEMICONDUCTOR ELEMENT AND POWER CONVERTER THEREOF

BACKGROUND OF THE INVENTION

1. Field of the Invention

The present invention relates to a gate turn-off thyristor or similar pressure-contact type semiconductor element, and to a power converter which utilizes the pressure-contact type semiconductor element.

2. Description of the Related Art

Pressure-contact type semiconductor elements such as gate turn-off thyristors (GTOs) are widely used in fields such as electric power and industry. Particularly the pressure-contact type semiconductor elements which are designed for high-power use demand ever greater capacity to meet the exigencies of high withstand voltage and heavy current. For this purpose it is vital to increase the number of element unit (the number of segments), and semiconductor substrates are becoming larger and larger.

FIG. 1 is a cross-sectional drawing of a conventional GTO. In FIG. 1, a pressure-contact type semiconductor element 1 comprises a semiconductor substrate 2, a gate electrode 2a formed on the front surface of the semiconductor substrate 2, a cathode 2b formed on the front surface of the semiconductor substrate 2, an anode 2c formed on the rear surface of the semiconductor substrate 2, a cathode-side buffer plate 3a, an anode-side buffer plate 3b, a cathode post electrode 4, an anode post electrode 5, an end passive component 6, a circular gate conductor 7 adjoining the gate electrode 2a, a gate lead 10 connected to the circular gate conductor 7, a gate lead 24 on the cathode side, a hold 22 which presses the circular gate conductor 7 elastically against the gate electrode 2a, and a circular insulating housing 11 which houses the semiconductor substrate 2, cathode post electrode 4, anode post electrode 5 and circular gate conductor 7.

When a gate current is applied to the gate lead 10, it flows by way of the circular gate conductor 7 to the gate electrode 2a, and the semiconductor element turns on.

In a semiconductor element configured in this manner, while segments in the vicinity of the gate lead are easily switched, those on the opposite side to the gate lead are not.

As semiconductor substrates become larger, increased imbalance of gate current distribution on the surface of the semiconductor element leads to a requirement for redundancy in the current withstand of the element, and current density falls.

SUMMARY OF THE INVENTION

Accordingly, on object of the present invention is to provide a novel pressure-contact type semiconductor element having a gate electrode configuration wherein gate current distribution is uniform across the surface of the element while every effort is made to prevent increased wiring inductance, along with a power converter which utilizes this element.

With a view to attaining the abovementioned object, the pressure-contact type semiconductor element to which the present invention pertains comprises a semiconductor substrate having a gate electrode and a cathode formed on the front surface thereof, and an anode formed on the rear surface thereof; a cathode post electrode capable of pressure contact with the anode with a buffer plate in between; an anode post electrode capable of pressure contact with the cathode with a buffer plate in between; a double circular gate conductor consisting of a first circular gate conductor adjoining the gate electrode, and second circular gate conductor adjoining a gate lead, and a connecting conductor to connect said first circular gate conductor and said second circular gate conductor; a hold which presses the second circular gate conductor elastically against a gate electrode; and an insulated housing which houses the semiconductor substrate, the cathode post electrode, the anode post electrode and the double circular gate conductor.

With a view to attaining the abovementioned object, the pressure-contact type semiconductor element to which the present invention pertains may have a first circular gate conductor and a second circular gate conductor which are vertical in relation to the semiconductor substrate and parallel with each other, the connecting conductor between the first circular gate conductor and the second circular gate conductor, and the point of connection between the gate lead and the second circular gate conductor being in symmetrical positions from the center of the semiconductor substrate.

With a view to attaining the abovementioned object, the pressure-contact type semiconductor element to which the present invention pertains may have a first circular gate conductor and a second circular gate conductor which are parallel with the semiconductor substrate and parallel with each other, the connecting conductor between the first circular gate conductor and the second circular gate conductor, and the point of connection between the gate lead and the second circular gate conductor being in symmetrical positions from the center of the semiconductor substrate.

With a view to attaining the abovementioned object, the pressure-contact type semiconductor element to which the present invention pertains may have a gate electrode and a first circular gate conductor which connect on an arc equidistantly from the center of the semiconductor substrate.

With a view to attaining the abovementioned object, the pressure-contact type semiconductor element to which the present invention pertains may also have a gate electrode and a first circular gate conductor which connect along the whole circumference on an arc around the center of the semiconductor substrate.

With a view to attaining the abovementioned object, the pressure-contact type semiconductor element to which the present invention pertains may also have a gate electrode and a first circular gate conductor which connect in a position on the outermost circumference of the semiconductor substrate.

With a view to attaining the abovementioned object, the pressure-contact type semiconductor element to which the present invention pertains may also have a gate electrode and a first circular gate conductor which connect in an intermediate radial position of the semiconductor substrate.

With a view to attaining the abovementioned object, the pressure-contact type semiconductor element to which the present invention pertains may also have a gate electrode and a first circular gate conductor which connect in a central position on the semiconductor substrate.

With a view to attaining the abovementioned object, the pressure-contact type semiconductor element to which the present invention pertains may also be equipped with a plurality of concentric double circular gate conductors comprising a first circular gate conductor, a second circular gate conductor and a connecting conductor.

With a view to attaining the abovementioned object, the pressure-contact type semiconductor element to which the present invention pertains may also be equipped with a plurality of gate leads adjoining the second circular gate conductor.

With a view to attaining the abovementioned object, the pressure-contact type semiconductor element to which the present invention pertains may also be such that the hold which presses the circular gate conductor elastically against the semiconductor substrate is equipped with a function of determining the position of the double circular gate conductor, and a function of insulating the first and second circular gate conductors.

With a view to attaining the abovementioned object, the pressure-contact type semiconductor element to which the present invention pertains, being a pressure-contact type semiconductor element with a laminated conductor comprising a first conductor layer and a second conductor layer insulated by an insulation layer connecting the pressure-contact type semiconductor element and a gate unit, may also have a slit in the first conductor layer.

With a view to attaining the abovementioned object, the pressure-contact type semiconductor element to which the present invention pertains, being a pressure-contact type semiconductor element with a laminated conductor comprising a first conductor layer and a second conductor layer insulated by an insulation layer connecting the pressure-contact type semiconductor element and a gate unit, may also be configured in such a manner that the first conductor layer is folded to constitute a third conductor layer, while the first and third conductive layers, gate lead, second conductive layer and cathode post are such that the voltage drop due to self-inductance or mutual inductance is equal.

With a view to attaining the abovementioned object, the power converter to which the present invention pertains is configured using a pressure-contact type ;semiconductor element.

BRIEF DESCRIPTION OF THE DRAWINGS

A more complete appreciation of the present invention and many of the attendant advantages thereof will readily be obtained as the same becomes better understood by reference to the following detained description when considered in connection with the accompanying drawings, wherein.

DETAILED DESCRIPTION OF THE PREFERRED EMBODIMENTS

Figure 1:
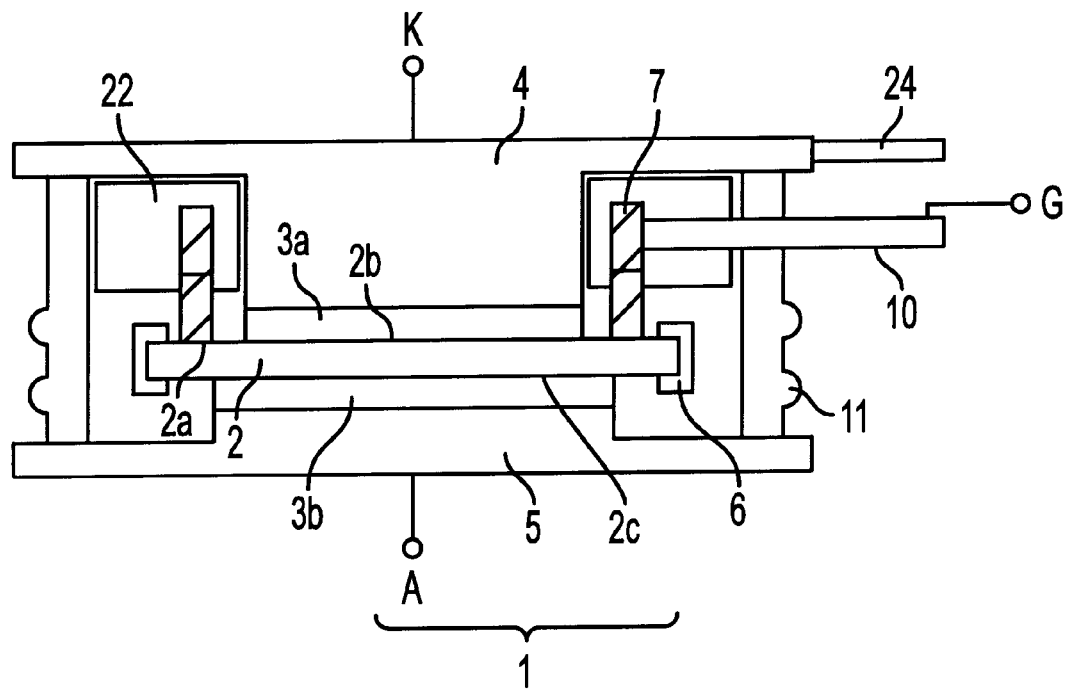
FIG. 1 is a cross-sectional drawing of a conventional pressure-contact type semiconductor element.

With reference now to the drawings, wherein like reference numerals designate identical or corresponding parts throughout the several views, and particularly to FIG. 2, a first embodiment of the present invention will be described.

Figure 2:
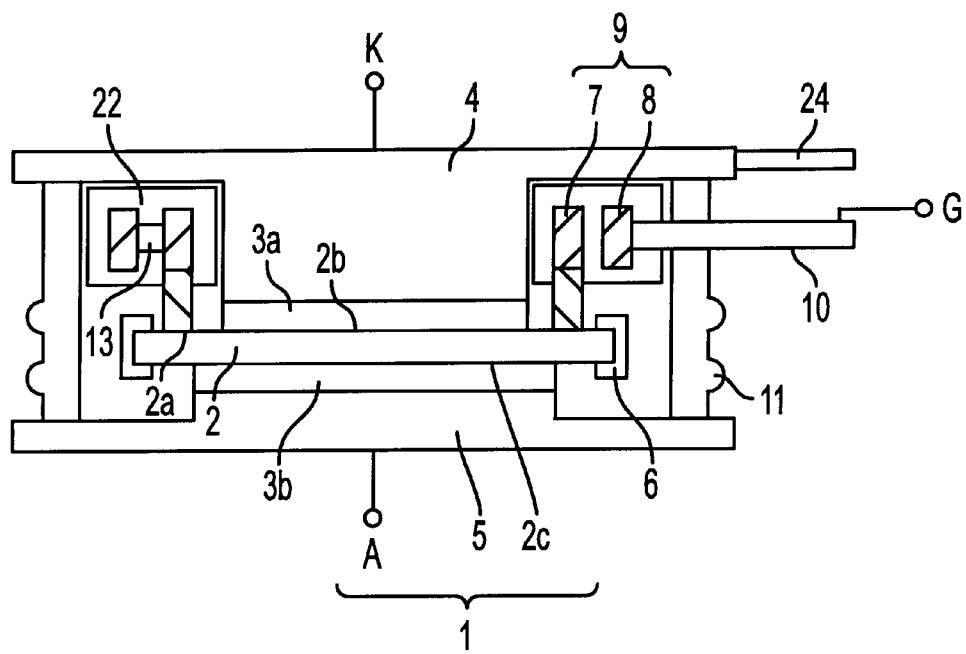
FIG. 2 is a cross-sectional drawing of a first embodiment of the present invention.

FIG. 2 is a cross-sectional drawing of the pressure-contact type semiconductor element to which the first embodiment of the present invention pertains. In FIG. 2, the pressure-contact type semiconductor element 1 comprises a semiconductor substrate 2, a gate electrode 2a formed on the front surface of the semiconductor substrate 2, a cathode 2b formed on the front surface of the semiconductor substrate 2, an anode 2c formed on the rear surface of the semiconductor substrate 2, a cathode-side buffer plate 3a, an anode-side buffer plate 3b, a cathode post electrode 4, an anode post electrode 5, an end passive component 6, a double circular gate conductor 9, a gate lead 10 connected to the double circular gate conductor 9, a gate lead 24 on the cathode side, a hold 22 which presses the double circular gate conductor 9 elastically against the gate electrode 2a while possessing the function of determining the position of the double circular gate conductor 9, and a circular insulating housing 11 which houses the semiconductor substrate 2, cathode post electrode 4, anode post electrode 5 and double circular gate conductor 9.

In this sort of configuration, the gate current flows from the gate lead 10 by way of the second circular gate conductor 8, connecting conductor 13, first circular conductor 7, gate electrode 2a on the front surface of the semiconductor substrate 2, cathode 2b on the front surface of the semiconductor substrate 2, and cathode post electrode 4 to the cathode-side gate lead 24.

In this case, if the inductance due to the current $I_1$ flowing through the first circular conductor 7 is L1, the inductance due to the current $I_2$ flowing through the second circular conductor 8 is L2, the inductance due to the current Ik flowing through the interior of the cathode post electrode 4 is Lk, and the mutual inductances due to the current are M12, M1k, M2k, the shape of the double circular gate conductor 9 is determined so as to fulfill the conditions of the following formula.

$$L_2 \times \frac{dI_1}{dt} - M_{12} \times \frac{dI_2}{dt} = L_k \times \frac{dI_k}{dt} - M_{1k} \times \frac{dI_2}{dt}$$

In other words, by ensuring that the voltage drop due to self-inductance or mutual inductance is equal, it is possible to guarantee more or less uniform parallel inductance through the segments. Moreover, the fact that the current flowing through the first circular gate conductor 7 and the current flowing through the second circular gate conductor 8 are balanced, ensuring that a uniform current flows to the gate electrode 2a, makes it possible to guarantee more or less uniform gate current distribution within the element surface. To be even more specific, it is desirable to consider also the effect of the current flowing through the gate electrode 2a of the semiconductor substrate 2, and of eddy current flowing through the anode post electrode 5.

If the current flowing through the second circular gate conductor 8 and the current flowing through the first circular gate conductor 7 and the interior of the cathode past electrode 4 are observed, it will be seen that they flow in opposite directions, cancelling out magnetic flux. The result is that there is scarcely any increase in wiring inductance, which makes it possible to realize high-speed switching.

Moreover, by ensuring that the first circular gate conductor 7 and the second circular gate conductor 8 are vertical in relation to the semiconductor substrate 2 and are parallel with each other, it is possible to increase mutual inductance, thereby reducing the wiring inductance of the double circular gate conductor 9 and making it possible to realize high-speed switching. In this case, the use of wide conductors for the gate conductor and gate lead enables wiring inductance to be reduced even further.

Meanwhile, the provision of a hold 22 which presses the double circular gate conductor 9 elastically against the semiconductor substrate 2 while possessing the function of determining the position of the double circular gate conductor 9 serves to prevent the double circular gate conductor 9 from becoming eccentric, and facilitates the attainment of a stable and uniform gate current distribution. What is more, the hold 22 doubles as an insulator between the first circular gate conductor 7 and second circular gate conductor 8, thus serving to shorten insulation distance.

There follows a description of a second embodiment of the present invention.

Figure 3:
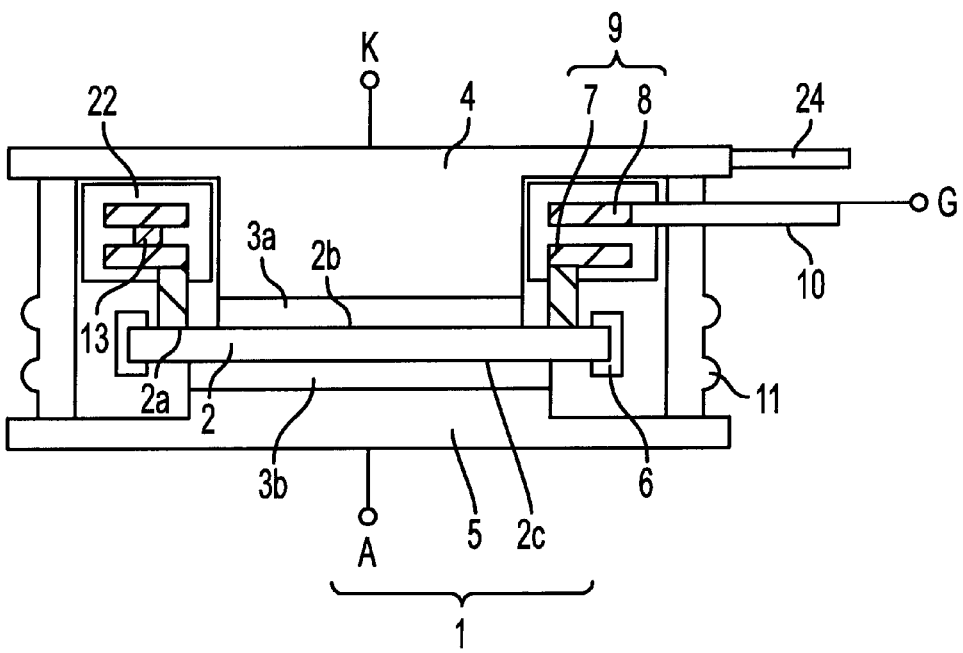
FIG. 3 is a cross-sectional drawing of a second embodiment of the present invention.

FIG. 3 is a cross-sectional drawing of the pressure-contact type semiconductor element to which the second embodiment of the present invention pertains. Those elements which are the same as in the first embodiment as illustrated in FIG. 2 have been allocated the same codes.

FIG. 3 differs from the first embodiment in the shape of the double circular gate conductor 9. In other words, the double circular gate conductor 9 comprises a first circular gate conductor 7 connected to a gate electrode 2a, a second circular gate conductor 8, and a connecting conductor 13, which connects the first circular gate conductor 7 and second circular gate conductor 8. The position of the various elements is such that the first circular gate conductor 7 and second circular gate conductor 8 are parallel with the semiconductor substrate 2, while at the same time being parallel with each other. In this manner it is possible to increase mutual inductance, thereby reducing the wiring inductance of the double circular gate conductor 9 and making it possible to realize high-speed switching. Moreover, the use of wide conductors for the gate conductor and gate lead enables wiring inductance to be reduced even further.

There follows a description of a third embodiment of the present invention.

Figure 4:
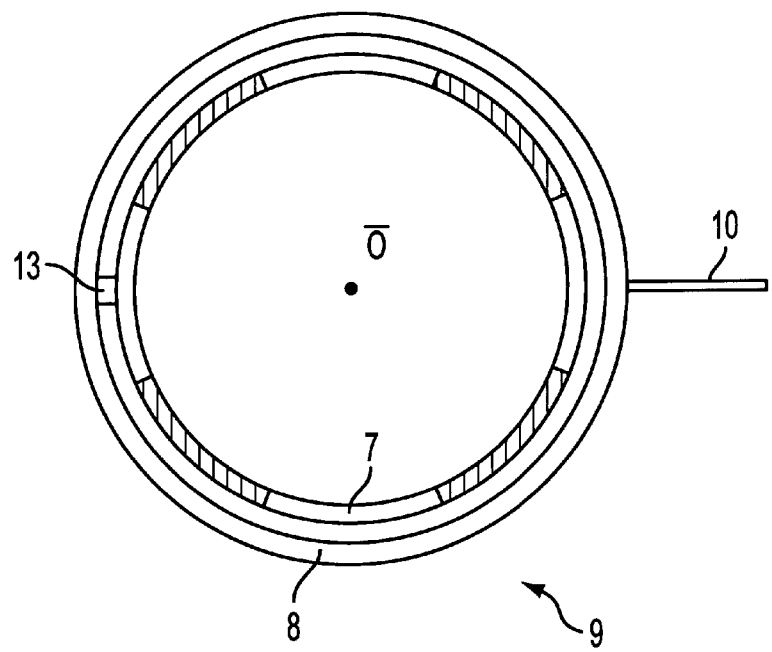
FIG. 4 is a top view of a third embodiment of the present invention.

FIG. 4 is a top view of the double circular gate conductor in the third embodiment of the present invention.

In FIG. 4, the double circular gate conductor 9 comprises a first circular gate conductor 7 connected to a gate electrode 2a, a second circular gate conductor 8, and a connecting conductor 13, which connects the first circular gate conductor 7 and second circular gate conductor 8. The connecting conductor 13 is positioned on the opposite side to the gate lead 10, which is connected to the second circular gate conductor 8.

Moreover, by connecting the gate electrode 2a and first circular gate conductor 7 equidistantly from the center O of the semiconductor substrate 2 on an arc of radius R (shaded sections), it is possible to reduce imbalance in current distribution due to anisotropy of connected position between the gate electrode 2a and first circular gate conductor 7. It is also possible to reduce imbalance due to elastic pressure.

There follows a description of a fourth embodiment of the present invention.

Figure 5:
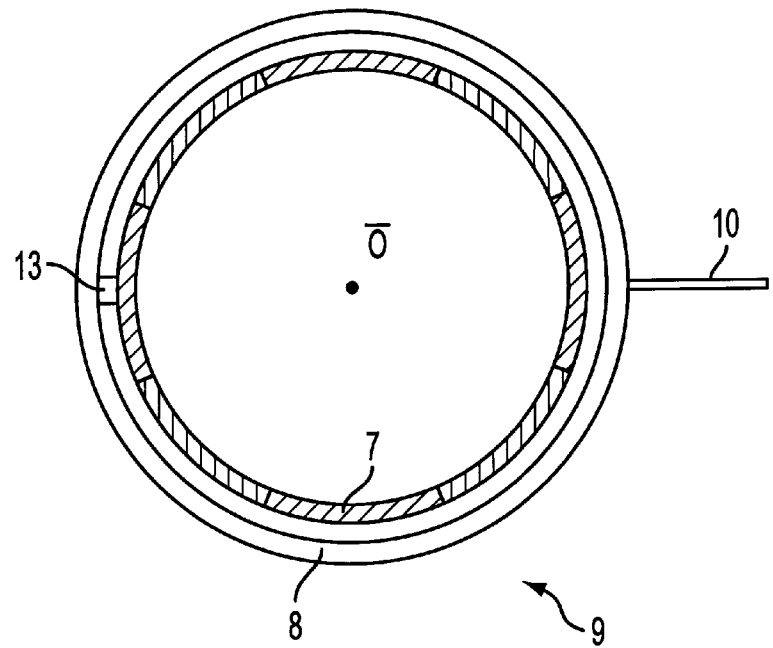
FIG. 5 is a top view of a fourth embodiment of the present invention.

FIG. 5 is a top view of the double circular gate conductor in the fourth embodiment of the present invention. Those elements which are the same as in the third embodiment as illustrated in FIG. 4 have been allocated the same codes.

FIG. 5 differs from the third embodiment in the shape of the double circular gate conductor 9.

The double circular gate conductor 9 comprises a first circular gate conductor 7 connected to a gate electrode 2a, a second circular gate conductor 8, and a connecting conductor 13, which connects the first circular gate conductor 7 and second circular gate conductor 8. The connecting conductor 13 is positioned on the opposite side to the gate lead 10, which is connected to the second circular gate conductor 8.

Moreover, by connecting the gate electrode 2a and first circular gate conductor 7 along the whole circumference on an arc of radius R from the center O of the semiconductor substrate 2, it is possible to reduce imbalance in current distribution due to anisotropy of connected position between the gate electrode 2a and first circular gate conductor 7. It is also possible to reduce imbalance due to elastic pressure.

There follows a description of a fifth embodiment of the present invention.

Figure 6:
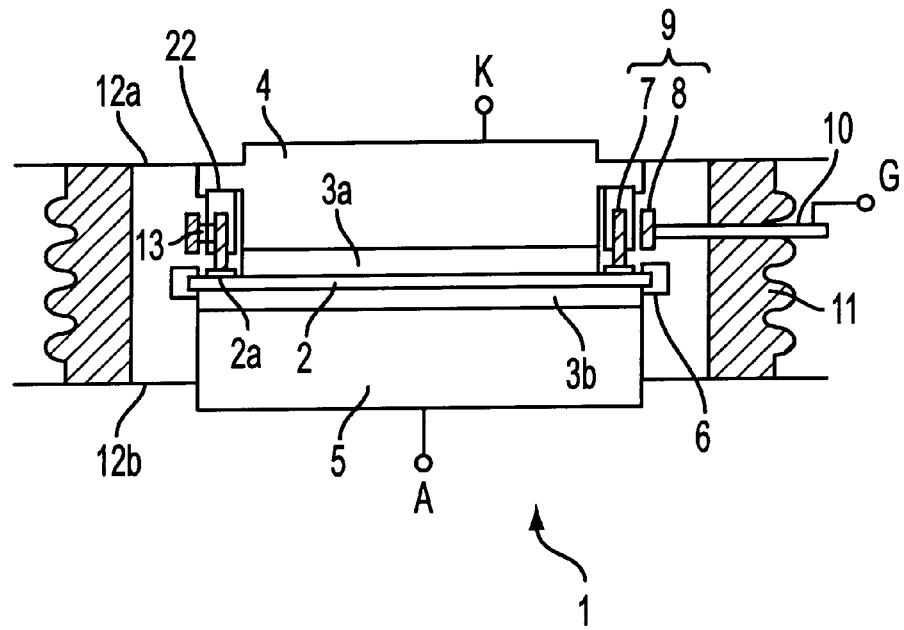
FIG. 6 is a cross-sectional drawing of a fifth embodiment of the present invention.

FIG. 6 is a cross-sectional drawing of the pressure-contact type semiconductor element to which the fifth embodiment pertains. Those elements which are the same as in FIG. 2 have been allocated the same codes, and will not be described again.

The characteristic of this embodiment consists in that the gate electrode 2a and first circular gate conductor 7 connect in a position on the outermost circumference of the semiconductor substrate 2.

This connection on the outermost circumference of the semiconductor substrate means that there is no need to fashion a slit in the interior of the post, and this simple configuration makes it possible to reduce gate current imbalance in the direction of the circumference.

There follows a description of a sixth embodiment of the present invention.

Figure 7:
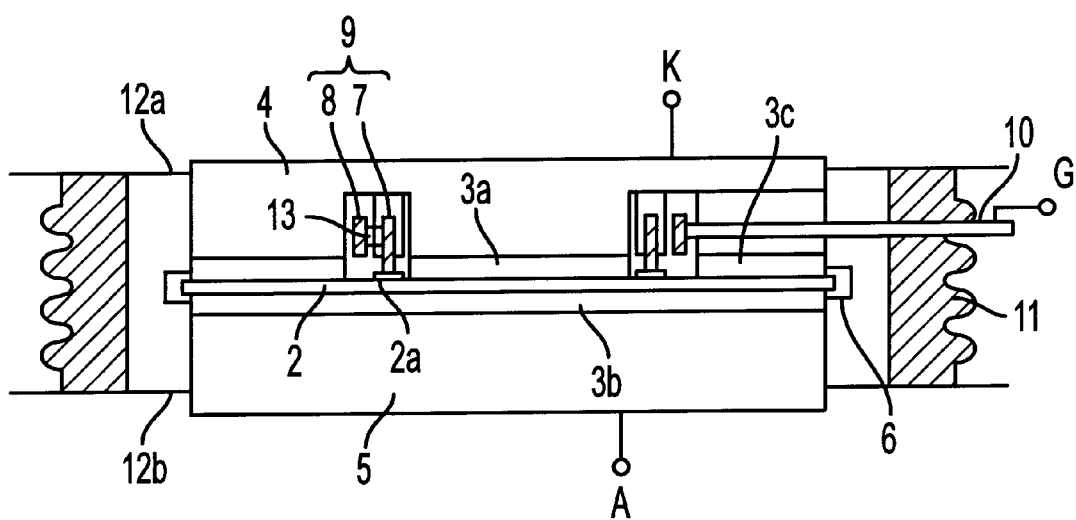
FIG. 7 is a cross-sectional drawing of a sixth embodiment of the present invention.

FIG. 7 is a cross-sectional drawing of the pressure-contact type semiconductor element to which the sixth embodiment pertains. Those elements which are the same as in FIG. 2 have been allocated the same codes, and will not be described again.

The characteristic of this embodiment consists in that the gate electrode 2a and first circular gate conductor 7 connect in an intermediate radial position on the semiconductor substrate 2. This connection in an intermediate radial position on the semiconductor substrate means that unlike the fifth embodiment there is need for a slit in the interior of the post to pass the electrodes through.

The connection in an intermediate radial position on the semiconductor substrate makes i possible to reduce gate current imbalance not only in the direction of the circumference, but in the radial direction also.

There follows a description of a seventh embodiment of the present invention.

Figure 8:
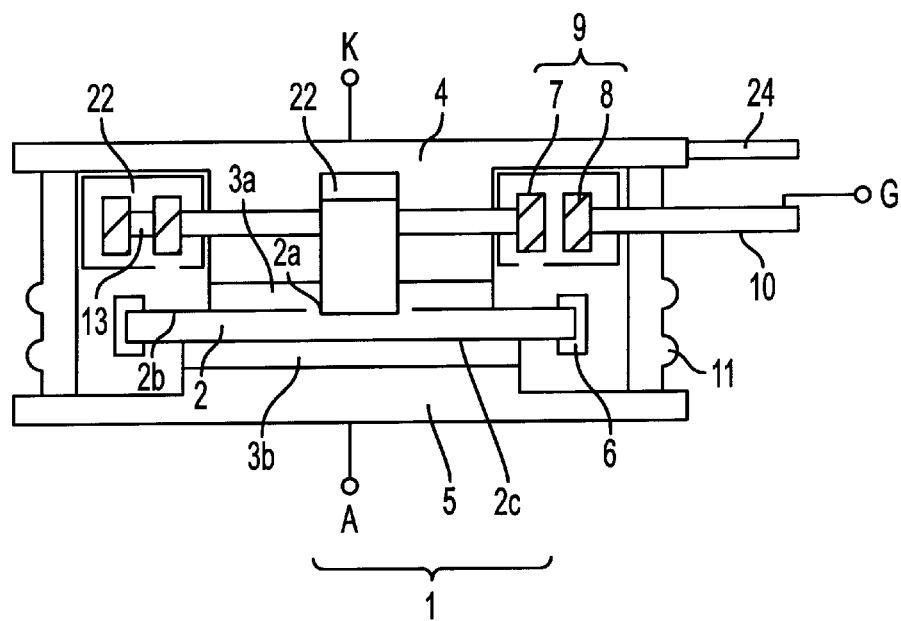
FIG. 8 is a cross-sectional drawing of a seventh embodiment of the present invention.

FIG. 8 is a cross-sectional drawing of the pressure-contact type semiconductor element to which the seventh embodiment pertains. Those elements which are the same as in FIG. 2 have been allocated the same codes, and will not be described again.

The characteristic of this embodiment consists in that the gate electrode 2a and first circular gate conductor 7 connect in a central position on the semiconductor substrate 2. This connection in a central position on the semiconductor substrate means that unlike the fifth embodiment there is need for a plurality of slits in the interior of the post to pass the electrodes through.

The connection in a central position on the semiconductor substrate makes it possible to reduce gate current imbalance over the whole area.

Figure 9:
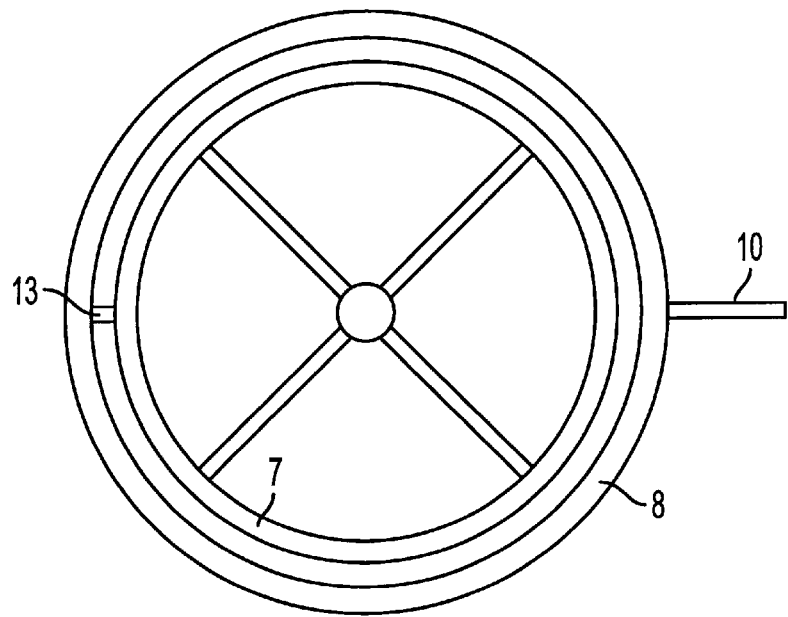
FIG. 9 is a top view of the double circular gate conductor of the seventh embodiment of the present invention.

FIG. 9 is a top view of this embodiment.

There follows a description of an eighth embodiment of the present invention.

Figure 10:
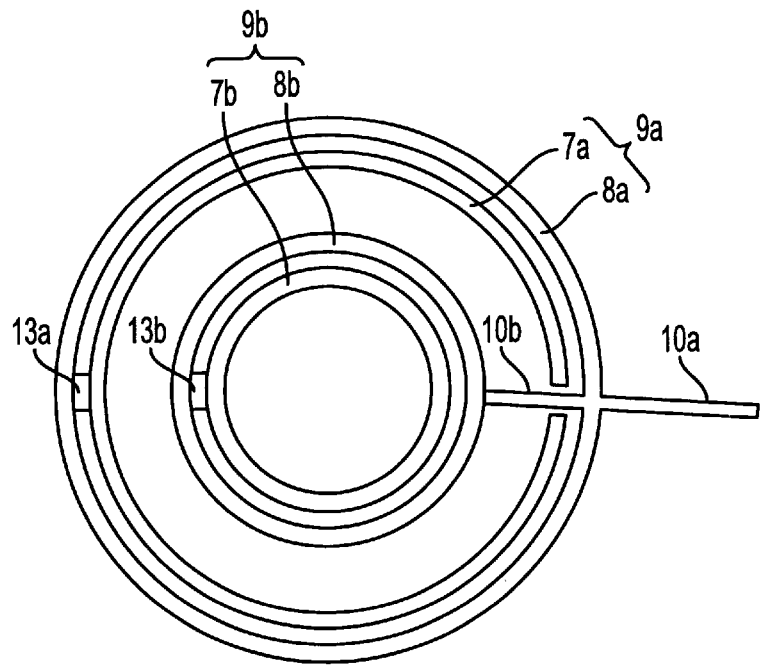
FIG. 10 is a top view of an eighth embodiment of the present invention.

FIG. 10 is a top view of the double circular gate conductor to which the eighth embodiment pertains.

In FIG. 10, the double circular gate conductor comprises two double circular gate conductors 9a and 9b, which are located concentrically. For instance, the outer double circular gate conductor 9a is connected to the gate electrode at a position on the outermost circumference of the semiconductor substrate, while the inner double circular gate conductor 9b is connected to the gate electrode in an intermediate radial position.

Each of the double circular gate conductors 9a, 9b comprises a first circular gate conductor 7a, 7b connected to the gate electrode, a second circular gate conductor 8a, 8b, and a connecting conductor 13a, 13b which serves to connect the first circular gate conductor 7a, 7b and second circular gate conductor 8a, 8b. The connecting conductor 13a, 13b is located on the opposite side to the gate lead 10a, 10b which is connected to the second circular gate conductor 8a, 8b.

Moreover, the shape of each of the double circular gate conductors 9a, 9b is determined so as to equalize the voltage drop due to self-inductance or mutual inductance among the first circular gate conductor 7, second circular gate conductor 8 and cathode post electrode 4. In this manner it is possible to guarantee more or less uniform parallel inductance through the segments. To be even more specific, it is desirable to consider also the effect of the current flowing through the gate electrode 2a of the semiconductor substrate 2, and of eddy current flowing through the anode post electrode 5.

By thus providing a plurality of concentric double circular gate conductors, it is possible to ensure equal gate current distribution at a position on the outermost circumference of the semiconductor substrate and in an intermediate radial position, for example. This makes it possible to reduce imbalance of gate current distribution both in the direction of the circumference of the semiconductor and in the radial direction.

There follows a description of a ninth embodiment of the present invention.

Figure 11:
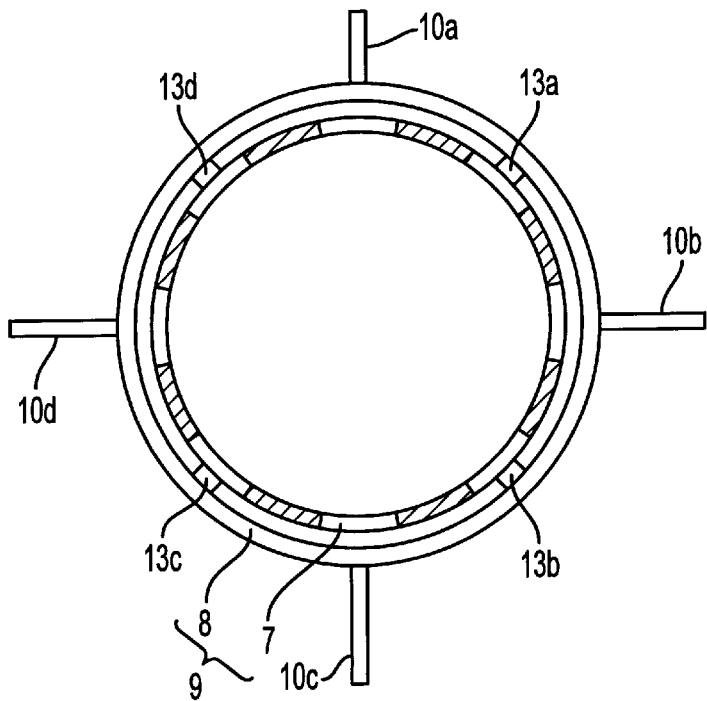
FIG. 11 is a top view of a ninth embodiment of the present invention.

FIG. 11 is a top view of the double circular gate conductor to which the ninth embodiment pertains.

In FIG. 11, the double circular gate conductor 9 comprises a first circular gate conductor 7 connected to the gate electrode, a second circular gate conductor 8, and a plurality of connecting conductors 13a, 13b, 13c and 13d which serve to connect the first circular gate conductor 7 and second circular gate conductor 8.

The connecting conductors 13 are located equidistantly, as also are gate leads 10a, 10b, 10c and 10d connected to the second circular gate conductor 8.

In this manner it is possible to reduce imbalance in gate current distribution despite the provision of a plurality of gate leads 10. Moreover, it is possible to reduce wiring inductance in the double circular gate conductor, and to realize high-speed switching.

There follows a description of a tenth embodiment of the present invention.

Figure 12:
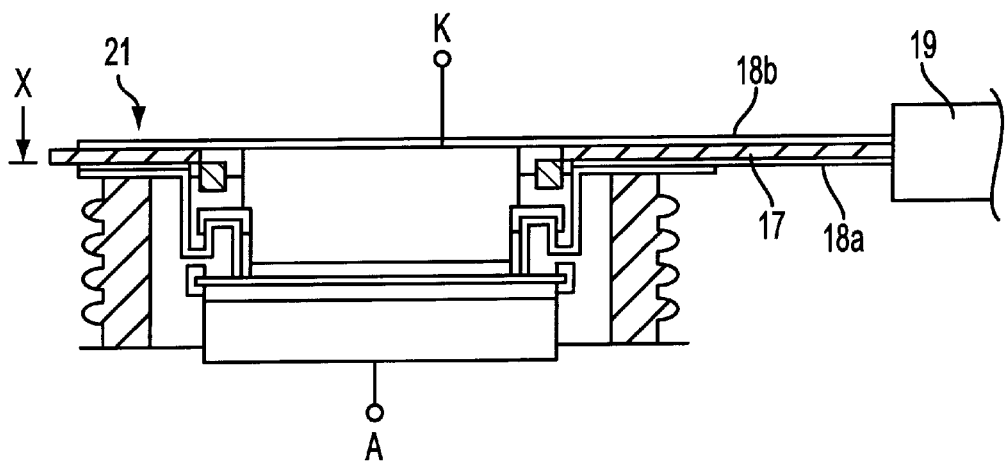
FIG. 12 is a cross-sectional drawing of a tenth embodiment of the present invention.

FIG. 12 is a cross-sectional drawing illustrating the configuration of the pressure-contact type semiconductor element and gate unit to which tenth embodiment pertains.

In FIG. 12, the semiconductor element and gate circuit unit are connected by means of a laminated connecting conductor 21.

The laminated connecting conductor 21 comprises an insulating layer 17 and conductor layers 18a and 18b. The conductor layers 18a and 18b are located adjoining each other and separated by the insulating layer 17.

Figure 13:
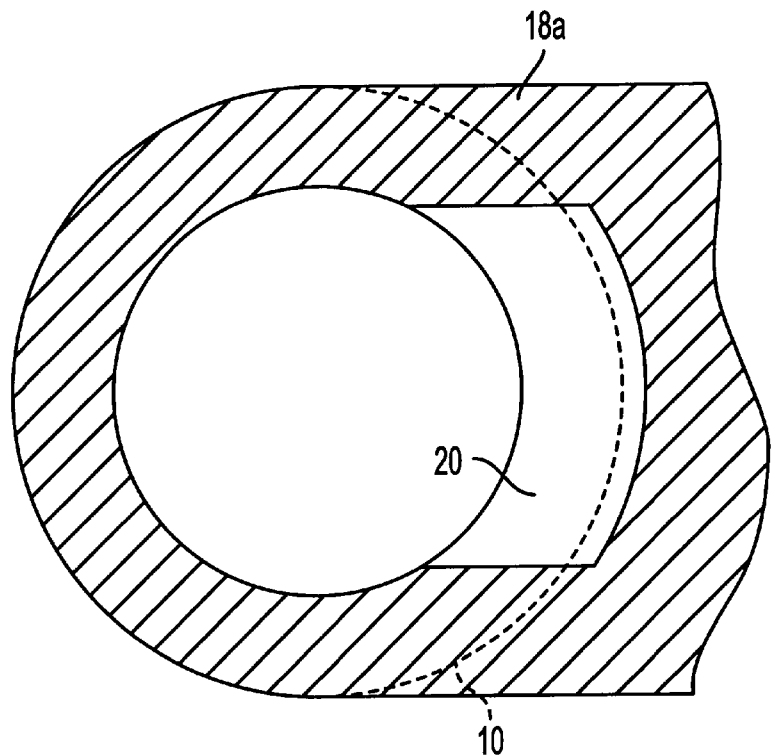
FIG. 13 is a view along the line X—X in the tenth embodiment of the present invention.

As FIG. 13 shows, the connecting conductor 18a is provided on the gate circuit unit 19 side with a slit 20.

Providing the connecting conductor 18a with a slit 20 in this manner eliminates convergence of gate current on the gate circuit unit 19 side, and makes it possible to reduce imbalance in gate current distribution on the semiconductor substrate.

There follows a description of an eleventh embodiment of the present invention.

Figure 14:
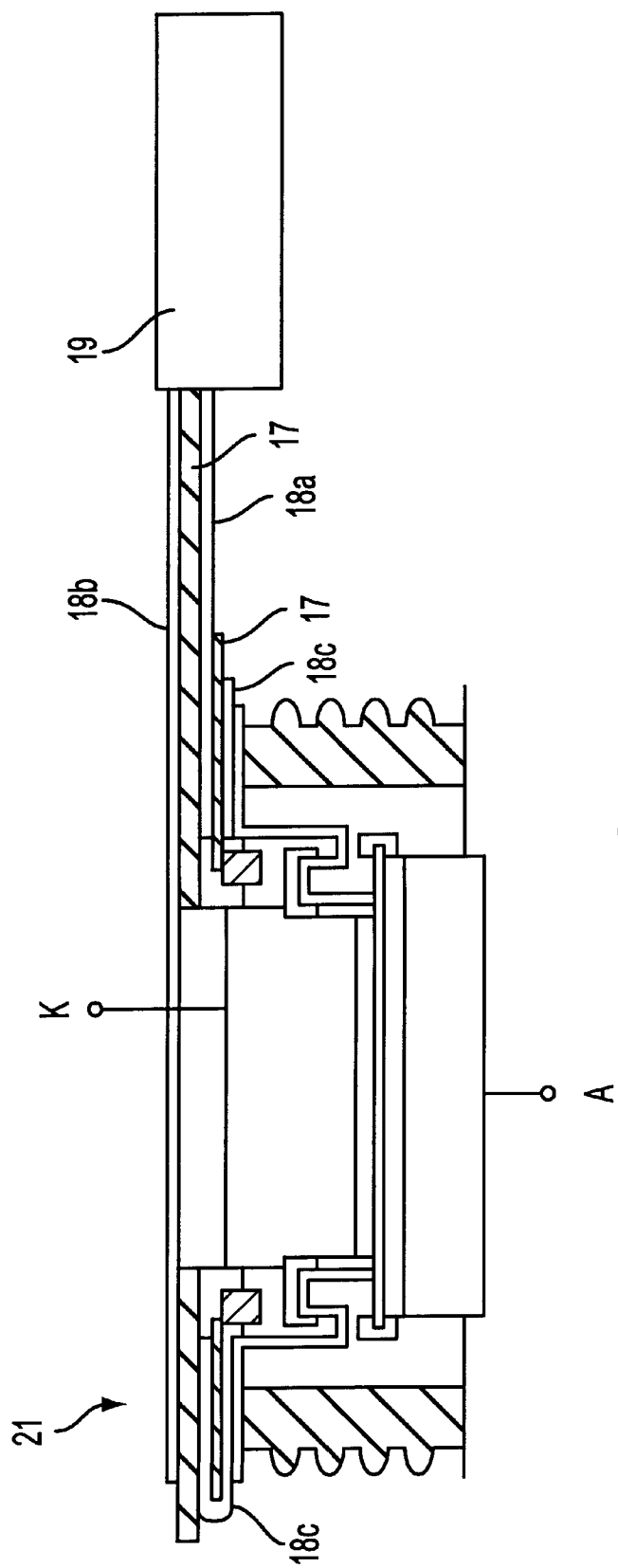
FIG. 14 is a cross-sectional drawing of an eleventh embodiment of the present invention.

FIG. 14 is a cross-sectional drawing illustrating the configuration of the pressure-contact type semiconductor element and gate unit to which tenth embodiment pertains.

In FIG. 14, the semiconductor element and gate circuit unit are connected by means of a laminated connecting conductor 21.

The laminated connecting conductor 21 comprises an insulating layer 17 and conductor layers 18a, 18b and 18c. The conductor layers 18a and 18c are the same conductor, a folded section forming the conductor layer 18c.

In this configuration, the gate current flows from the conductor layer 18a by way of the conductor layer 18c, gate lead 10, semiconductor substrate 2 and cathode post 4 to the conductor layer 18b.

In this case, by equalizing the voltage drop due to self-inductance or mutual inductance between the conductor layers 18a, 18c, gate lead 10, conductor layer 18b and cathode post 4, it is possible to reduce imbalance in gate current distribution.

By equalizing gate current distribution on the surface of the semiconductor substrate, the pressure-contact type semiconductor element to which the present invention pertains makes it possible to improve breakdown withstand and increase capacity.

Obviously, numerous additional modifications and variations to the present invention are possible in the light of the above teachings. It is therefore to be understood that within the scope of the appended claims the present invention may be practised otherwise than as specifically described herein.

What is claimed is:

1. A pressure-contact type semiconductor element comprising:

a semiconductor substrate having a gate electrode and a cathode electrode formed on the front surface thereof, and an anode formed on the rear surface thereof;

a cathode post electrode capable of pressure contact with said anode with a buffer plate in between;

an anode post electrode capable of pressure contact with said cathode with a buffer plate in between;

a double circular gate conductor consisting of a first circular gate conductor adjoining said gate electrode, a second circular gate conductor adjoining a gate lead and a connecting conductor to connect said first circular gate conductor with said second circular gate conductor;

a hold which presses said second circular gate conductor elastically against said gate electrode; and an insulated housing which houses said semiconductor substrate, said cathode post electrode, said anode post electrode and said double circular gate conductor.

2. The pressure-contact type semiconductor element according to claim 1, wherein:

said first circular gate conductor and said second circular gate conductor are vertical in relation to said semiconductor substrate and parallel with each other, said connecting conductor between said first circular gate conductor and said second circular gate conductor, and the point of connection between said gate lead and said second circular gate conductor are in symmetrical positions form the center of said semiconductor substrate.

3. The pressure-contact type semiconductor element according to claim 1, wherein:

said first circular gate conductor and said second circular gate conductor are parallel with said semi-conductor substrate and parallel with each other, the connecting conductor between said first circular gate conductor and said second circular gate conductor, and the point of connection between said gate lead and said second circular gate conductor being in symmetrical positions from the center of said semiconductor substrate.

4. The pressure-contact type semiconductor element according to claim 1, wherein:

said gate electrode and said first circular gate conductor connect on an arc equidistantly from the center of said semiconductor substrate.

5. The pressure-contact type semiconductor element according to claim 1, wherein:

said gate electrode and said first circular gate conductor connect along the whole circumference on an arc around the center of said semiconductor substrate.

6. The pressure-contact type semiconductor element according to claim 1, wherein:

said gate electrode and said first circular gate conductor connect in a position on the outermost circumference of said semiconductor substrate.

7. The pressure-contact type semiconductor element according to claim 1, wherein:

said gate electrode and said first circular gate conductor connect in an intermediate radial position on said semiconductor substrate.

8. The pressure-contact type semiconductor element according to claim 1, wherein:

said gate electrode and said first circular gate conductor connect in a central position on said semiconductor substrate.

9. The pressure-contact type semiconductor element according to claim 1, further comprising:

a plurality of concentric double circular gate conductors comprising said first circular gate conductor, said second circular gate conductor and a connecting conductor.

10. The pressure-contact type semiconductor element according to claim 1, further comprising:

a plurality of gate leads adjoining said second circular gate conductor.

11. The pressure-contact type semiconductor element according to claim 1, wherein:

said hold which presses the circular gate conductor elastically against said semiconductor substrate is equipped with a function of determining the position of said double circular gate conductor, and a function of insulating said first and second circular gate conductors.

12. The pressure-contact type semiconductor element according to claim 1, wherein:

said pressure-contact type semiconductor element has a laminated conductor comprising a first conductor layer and a second conductor layer insulated by an insulation layer connecting said pressure-contact type semiconductor element and a gate unit, and said first conductor layer has a slit.

13. The pressure-contact type semiconductor element according to claim 1, further comprising:

a third conductor layer made by that a first conductor layer is folded to make said third conductor layer, while said first and third conductive layers, gate lead, second conductive layer and cathode post are such that the voltage drop due to self-inductance or mutual inductance is equal, wherein:

said pressure-contact type semiconductor element has a laminated conductor comprising said first conductor layer and said second conductor layer insulated by an insulation layer connecting said pressure-contact type semiconductor element and a gate unit.

14. A power converter comprising:

said pressure-contact type semiconductor element described in any of claim 1.

* * * * *